United States Patent [19]

Pitasi

[11] Patent Number: 4,682,269
[45] Date of Patent: Jul. 21, 1987

[54] HEAT DISSIPATION FOR ELECTRONIC COMPONENTS ON A CERAMIC SUBSTRATE

[75] Inventor: Martin J. Pitasi, Newbury, Mass.

[73] Assignee: Teradyne, Inc., Boston, Mass.

[21] Appl. No.: 908,779

[22] Filed: Sep. 9, 1986

Related U.S. Application Data

[63] Continuation-in-part of Ser. No. 659,648, Oct. 11, 1984, abandoned.

[51] Int. Cl.$^4$ .............................................. H05K 7/20
[52] U.S. Cl. .................................... 361/386; 165/185; 174/16 HS; 361/388

[58] Field of Search ................... 174/16 HS; 361/381, 361/313–388, 400, 401, 414; 165/80.3, 185; 357/81

[56] References Cited

U.S. PATENT DOCUMENTS 4,541,004  9/1985  Moore .................................. 357/81

Primary Examiner—A. D. Pellinen
Assistant Examiner—Greg Thompson

[57] ABSTRACT

A heat dissipator for electronic components comprising a ceramic plate having a first surface for receiving heat from the electronic components and a second surface, and a plurality of separate, spaced metallic, heat-conducting elements mounted on and extending from the second surface of the ceramic plate.

7 Claims, 3 Drawing Figures

U.S. Patent   Jul. 21, 1987   4,682,269
FIG 1
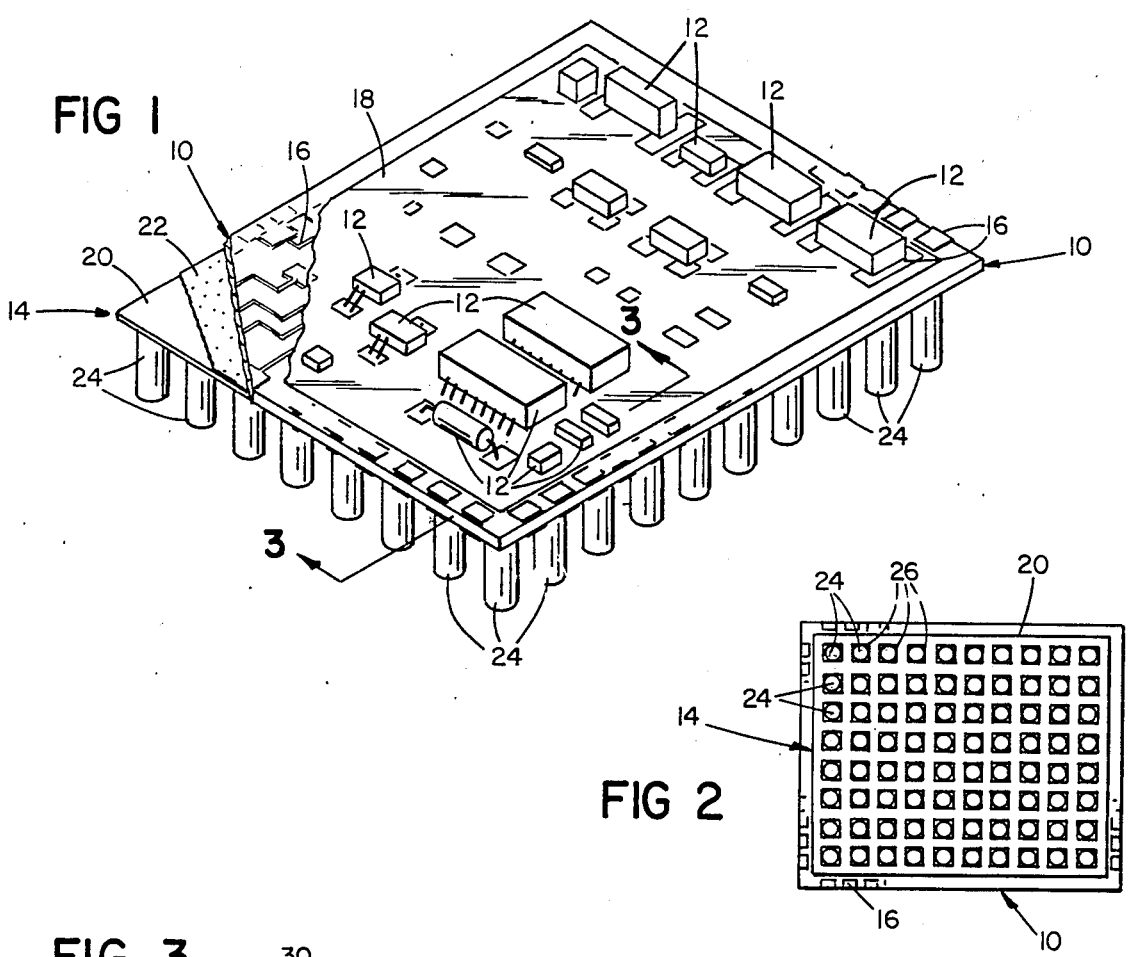
FIG 2
FIG 3
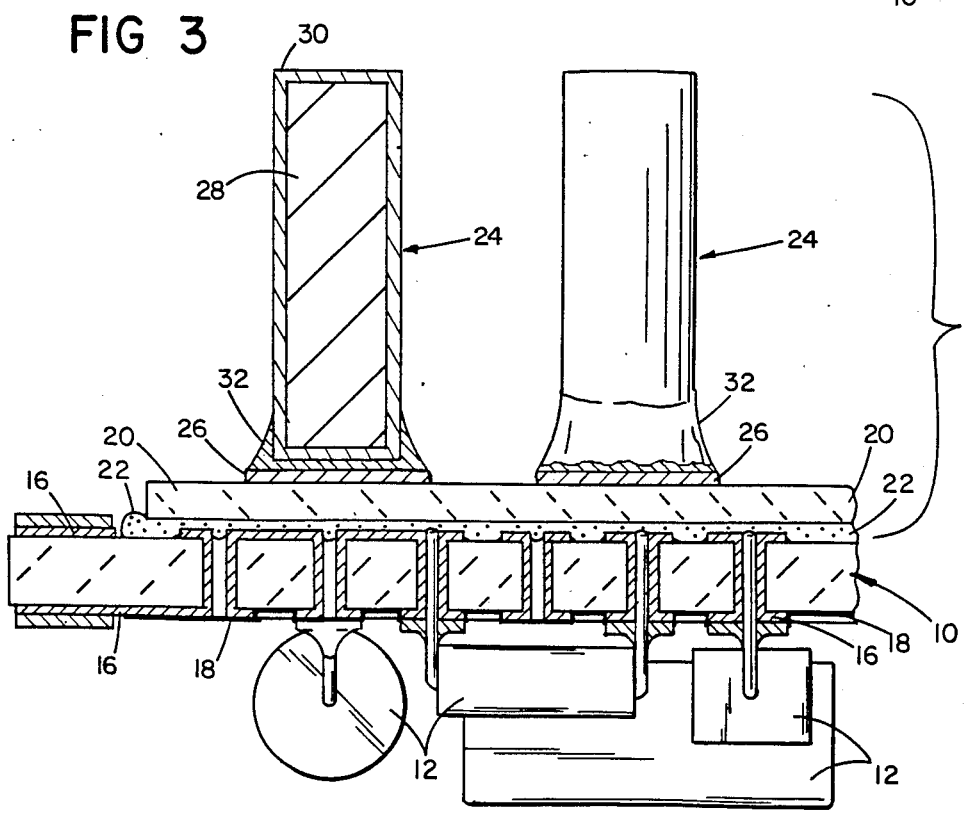

HEAT DISSIPATION FOR ELECTRONIC COMPONENTS ON A CERAMIC SUBSTRATE

This application is a continuation-in-part of application Ser. No. 659,648, filed Oct. 11, 1984 now abandoned.

FIELD OF THE INVENTION

The invention relates to dissipating heat from electronic components on a ceramic substrate.

BACKGROUND OF THE INVENTION

Electronic components can be mounted on a ceramic substrate and electrically connected to each other through metallized conductors carried by the substrate. Lee U.S. Pat. No. 4,292,647 discloses a semiconductor package including a plurality of electronic chips mounted on a ceramic substrate and provided with individual heat conductive elements mounted directly above them. Moore U.S. Pat. No. 4,541,004 discloses placing heat conducting pins either in a semiconductor package or in a substrate attached to a semiconductor package.

SUMMARY OF THE INVENTION

I have discovered that heat can be very effectively dissipated from electronic components through the use of a ceramic plate that is adhered to a ceramic substrate carrying electronic components and receives heat from the components at one surface and has a plurality of separate, spaced metallic cylindrical heat-conducting elements mounted on and extending from the other surface of the plate. The elements and exposed portions of the plate have a combined surface area greater than 1.5 times the surface area of the plate alone, increasing the heat dissipating surface.

In preferred embodiments the combined surface area is greater than 2.4 (most preferably between 3.5 to 4.0) times the surface area of the plate alone; the metallic elements are cylindrical copper pins; and the pins are connected to the ceramic plate via solder and metallized pads desposited on the ceramic plate.

Because both plates are made of ceramic, there are no thermal stresses between them. Also, the ceramic plate being 0.040" thick diffuses heat well, making the difference in temperature among the various pins low and promoting efficient heat dissipation. Finally, the copper pins provide good heat transfer to and low pressure drop in air passing next to them, and the solder provides good bond strength and little thermal resistance to heat passing through it.

BRIEF DESCRIPTION OF THE DRAWINGS

FIG. 1 is a diagrammatic perspective view, partially broken away, of a heat dissipator shown attached to a ceramic substrate carrying electronic components according to the invention.

FIG. 2 is a bottom plan view of the FIG. 1 dissipator.

FIG. 3 is a vertical sectional view, taken at 3—3 of FIG. 1 and upside-down with respect ot FIG. 1, of a portion of the FIG. 1 dissipator.

DETAILED DESCRIPTION OF THE PREFERRED EMBODIMENT

Referring to FIG. 1, there is shown ceramic substrate 10, which carries electronic components 12 on its upper surface and is secured to heat dissipator 14 at its lower surface. Electronic components 12 are electrically connected to each other by metallization 16 on the upper and lower surfaces of ceramic plate 10, and the upper surface of plate 10 also carries insulating coating 18 over metallization 16. Dissipator 14 includes ceramic plate 20 (95% pure alumina), thermosetting adhesive layer 22 (5 mil thick and available from 3M under the YN469 or YN568 trade designations) and metallic heat-conducting pins 24 on its lower surface.

Referring to FIG. 2, the arrangement of pins 24 on the lower surface of plate 20 is shown. Pins 24 are mounted on 0.125 by 0.125 inch square palladium/silver vacuum deposited pads 26, which are spaced from each other by 0.094 inch in the width direction and 0.108 inch in the length direction. Referring to FIG. 3, pins 24 are approximately 0.1 inch in diameter and ¼ inch long and include copper core 28 and tin coating 30. Pins 24 are attached to pads 26 by solder 32. The total area of plate 20 thus is 4.50 sq. in (1.846" wide times 2.438" long); the total surface area of the pins is 6.908 sq. in., and the total surface area of the exposed portions of plate 20 and the pins is 10.78 sq. in. Thus the addition of pins has increased total dissipating surface area from that of a plate without pins from 4.50 sq. in. to 10.78 sq. in., an increase of about 2.4. The density of pins can be less than the 2.4 ratio (e.g., greater than 1.5) and still beneficially dissipate heat or can advantageously be increased even more; e.g., ratios of total area to that of the plate alone of between 3.5 and 4.0 are believed to be optimum.

Heat dissipator 14 is made by securing pins 24 in a jig providing them with the proper arrangement and applying solder paste to the exposed ends of pins 24. Ceramic plate 20 with pads 26 thereon is placed on the exposed ends of pins 24, and pins 24 and ceramic plate 20 are joined to each other by vapor soldering. After the pin/ceramic assembly has cooled, adhesive layer 22 is applied, and this is covered with a release layer (not shown), which is removed prior to adhering to substrate 10. Heat dissipator 14 is easily adhered to substrate 10 by bringing the lower surface of ceramic plate 10 in contact with exposed adhesive layer 22, which cures in use. Adhesive layer 22 is 5 mils thick to compensate for irregularities in the planarity of the ceramic plate surfaces.

In operation, heat from electronic components 12 is conducted through layers 10, 22, 20 to heat-conducting pins 24, from which the heat is transferred to the surrounding air flowing past them. Because ceramic plate 20 diffuses heat well, the difference in temperature among various pins 24 is low, and heat dissipation to the air is efficient. Because plate 20 and ceramic plate 10 are both ceramic, there are no thermal stresses between them. Also the metal elements do not restrain the plate from expansion, as they are small in diameter, are spaced from each other on the plate and have freestanding ends that are not attached to anything that would restrain movement of the elements as the ceramic plate on which they are mounted expands. The sole purpose of the elements is to dissipate heat; they are not electrically connected to any components. Moreover, they are not aligned with individual components, but are instead mounted in an array across the bottom of the plate to efficiently dissipate heat owing to their ability to break up boundary layers and the additional surface area. Copper pins 24 provide good heat transfer to and low pressure drip in air flowing past them. Solder 32 provides good bond strength and little thermal resistance to heat passing through it. The cylindrical shape of the heat conducting elements is also highly significant because airflow can be in any direction when using the claimed cylindrical elements, and one can merely place the heat dissipator in a large chamber with many other components that would tend to deflect air in difficult to predict ways. There is no need to direct airflow to heat conducting elements by ducting or otherwise or to place them in a specific orientation, as there is with fins. The cylindrical shape is also very efficient in dissipating heat, as boundary layers do not build up, as they do with flat fins or plates.

Other embodiments of the invention are within the scope of the following claims.

What is claimed is:

1. The combination of a ceramic substrate carrying electronic components and a heat dissipator for the electronic components, said combination comprising
   a ceramic substrate carrying electronic components on one surface and having an opposite surface,
   a ceramic plate adjacent to said ceramic substrate and having a first surface adhered in heat conductive relationship to said opposite surface of said substrate by a layer of adhesive, said plate having a second surface, and
   a plurality of separate, spaced, free-standing, metallic, cylindrical heat-conducting elements mounted in an array on and extending from said second surface of said ceramic plate, said heat conducting elements being electrically isolated from said electronic components, said elements and exposed portions of said ceramic plate having a combined surface area greater than 1.5 times the surface area of said ceramic plate alone.

2. The combination of claim 1 wherein said combined surface area is greater than 2.4 times the surface area of said ceramic plate alone.

3. The combination of claim 2 wherein said combined surface area is between 3.5 and 4.0 times the surface area of said ceramic plate alone.

4. The combination of claim 1 wherein said metallic elements are soldered to metallized pads on said second surface.

5. The combination of claim 4 wherein said metallic elements are made of copper.

6. The combination of claim 4 wherein said metallized pads are made of a palladium/silver alloy.

7. The combination of a ceramic substrate carrying electronic components and a heat dissipator for the electronic components, said combination comprising
   a ceramic substrate carrying electronic components on one surface and having an opposite surface,
   a ceramic plate adjacent to said ceramic substrate and having a first surface adhered in heat conductive relationship to said opposite surface of said substrate by a layer of adhesive, said plate having a second surface, and
   a plurality of separate, spaced, free-standing, metallic, cylindrical heat-conducting elements mounted in an array on and extending from said second surface of said ceramic plate, said heat conducting elements being electrically isolated from said electronic components, said elements having a surface area greater than the surface area of said ceramic plate alone.

* * * * *